(12) United States Patent
Ribeiro et al.

(10) Patent No.: US 11,789,041 B2
(45) Date of Patent: Oct. 17, 2023

(54) ROGOWSKI COIL POSITIONING AND RETAINING APPARATUS

(71) Applicant: UBICQUIA, INC., Fort Lauderdale, FL (US)

(72) Inventors: Claudio Santiago Ribeiro, Evanston, IL (US); Jason Gebhardt, Palatine, IL (US); Eduardo Marabotto, Miami, FL (US)

(73) Assignee: Ubicquia, Inc., Fort Lauderdale, FL (US)

( * ) Notice: Subject to any disclaimer, the term of this patent is extended or adjusted under 35 U.S.C. 154(b) by 0 days.

(21) Appl. No.: 17/497,839

(22) Filed: Oct. 8, 2021

(65) Prior Publication Data

US 2022/0113337 A1    Apr. 14, 2022

Related U.S. Application Data

(60) Provisional application No. 63/089,480, filed on Oct. 8, 2020.

(51) Int. Cl.
*G01R 15/18* (2006.01)
*H01F 38/30* (2006.01)

(52) U.S. Cl.
CPC .......... *G01R 15/181* (2013.01); *H01F 38/30* (2013.01)

(58) Field of Classification Search
CPC ...... G01R 15/181; H01F 38/30; H01F 27/306
USPC ........................................................ 324/127
See application file for complete search history.

(56) References Cited

U.S. PATENT DOCUMENTS

| 4,746,241 A | 5/1988 | Burbank, III |
| 2008/0035801 A1 | 2/2008 | Adams et al. |
| 2012/0256617 A1 | 10/2012 | Moreux et al. |
| 2016/0055963 A1* | 2/2016 | Lockstedt ............ G01R 15/181 336/105 |

(Continued)

FOREIGN PATENT DOCUMENTS

| KR | 10-1468887 B1 | 12/2014 |
| KR | 10-1707152 B1 | 2/2017 |
| WO | WO-2022018326 A1 * | 1/2022 |

OTHER PUBLICATIONS

Korean Intellectual Property Office, International Search Report issued in connection with counterpart International Application No. PCT/US2021/054317, dated Jan. 27, 2022, 4 pages.

(Continued)

*Primary Examiner* — Tung X Nguyen
*Assistant Examiner* — Robert P Alejnikov, Jr.
(74) *Attorney, Agent, or Firm* — Daniel C. Crilly; Thomas J. Satagaj

(57) ABSTRACT

An apparatus for positioning and retaining a current transformer, such as a Rogowski coil, about a conductor includes at least two members, a coupling mechanism, and a non-conductive securing structure. Each member of the apparatus includes a respective retention structure configured to receive a respective section of the Rogowski coil. The coupling mechanism is configured to movably deploy at least one of the apparatus members relative to the other and around the conductor, which may be a distribution transformer power node. The securing structure is configured to engage the conductor and retain the apparatus members in fixed positions relative to the conductor and to each other.

18 Claims, 12 Drawing Sheets

(56) References Cited

U.S. PATENT DOCUMENTS

2017/0176501 A1* 6/2017 Schneider ................ G01R 1/04

OTHER PUBLICATIONS

Korean Intellectual Property Office, Written Opinion of the International Searching Authority issued in connection with counterpart International Application No. PCT/US2021/054317, dated Jan. 27, 2022, 5 pages.

* cited by examiner

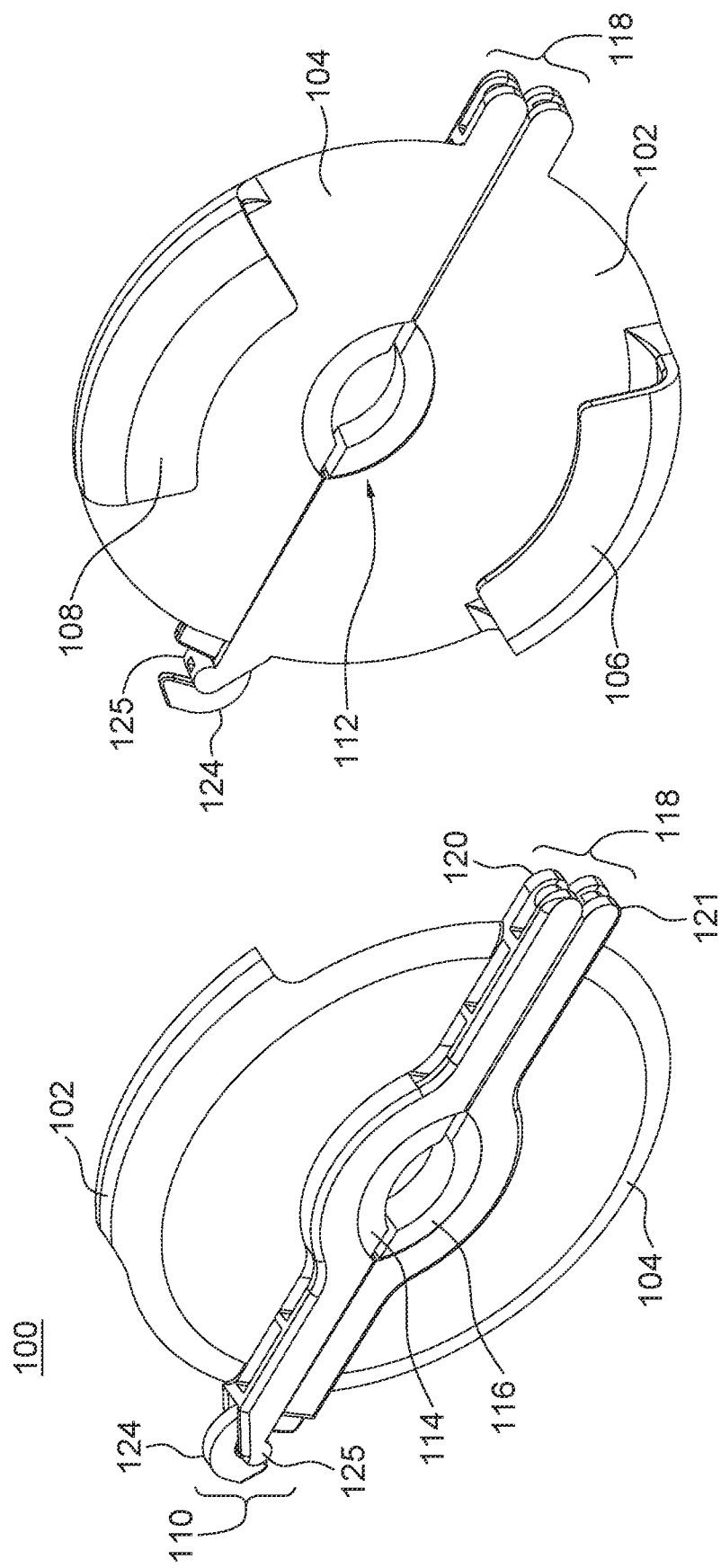

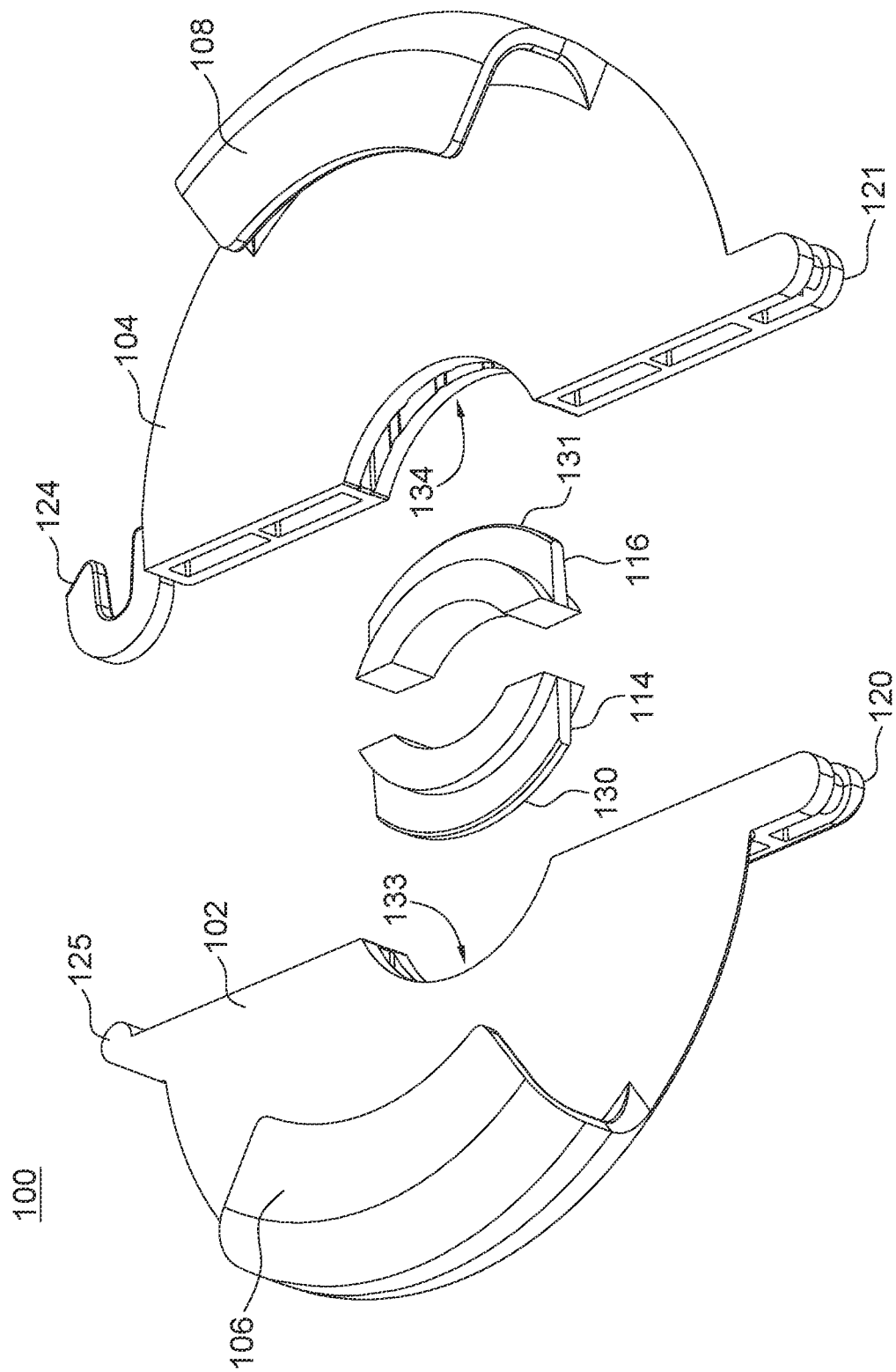

ured to receive a respective section of the Rogowski coil. The coupling mechanism is configured to movably deploy at least one of the apparatus members relative to the other and around the conductor. The securing structure is configured to engage the conductor and retain the apparatus members in fixed positions relative to the conductor and to each other.

ROGOWSKI COIL POSITIONING AND RETAINING APPARATUS

CROSS-REFERENCE TO RELATED APPLICATIONS

The present application claims priority upon and the benefit of U.S. Provisional Application No. 63/089,480, which was filed on Oct. 8, 2020 and is incorporated herein by reference in its entirety.

TECHNICAL FIELD

The present disclosure relates generally to use of a Rogowski coil and, more particularly, to an apparatus for positioning and retaining a Rogowski coil around a conductor, such as a distribution transformer power node.

BACKGROUND

A Rogowski coil is an electrical device for measuring alternating current (AC), high-speed current pulses, or other persistent or transient signals in a conductor. The construction and use of a Rogowski coil are known by those of skill in the art. To obtain most accurate results, the conductor with which a Rogowski coil is used should pass through the center of the Rogowski coil. Maintaining centricity of the conductor may be difficult depending on the construction of the Rogowski coil and the location of the conductor to be sensed.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventors' approach to solving the particular problem, which, in and of itself, may also be inventive.

BRIEF SUMMARY

The following is a summary of the present disclosure to provide an introductory understanding of some features and context. This summary is not intended to identify key or critical elements of the present disclosure or to delineate the scope of the disclosure. This summary presents certain concepts of the present disclosure in a simplified form as a prelude to the more detailed description that is later presented.

The device, method, and system embodiments described in this disclosure (i.e., the teachings of this disclosure) enable placement and retention of one or more Rogowski coils on or about respective one or more conductors, such as power nodes of a distribution transformer. The disclosure describes how to attain stability and rigidity of the Rogowski coil about the conductor. The disclosure also describes an apparatus that may maintain a substantially uniform distance from the center of the conductor to each section of the Rogowski coil.

According to one exemplary embodiment, an apparatus for positioning and retaining a current transformer, such as a Rogowski coil, about a conductor (bare or insulated) includes at least two members, a coupling mechanism, and a non-conductive securing structure. Each member of the apparatus includes a respective retention structure configured to receive a respective section of the Rogowski coil. The coupling mechanism is configured to movably deploy at least one of the apparatus members relative to the other and around the conductor. The securing structure is configured to engage the conductor and retain the apparatus members in fixed positions relative to the conductor and to each other.

According to another exemplary embodiment, an apparatus for positioning and retaining a current transformer, such as a Rogowski coil, about a conductor includes a pair of members, a coupling mechanism, and a pair of non-conductive arched elements. According to this embodiment, a first member of the pair defines a first pocket and includes a first bracket configured to receive a first section of the Rogowski coil. The second member of the pair defines a second pocket and includes a second bracket configured to receive a second section of the Rogowski coil. The coupling mechanism is configured to movably deploy at least one of the first member and the second member relative to each other and around the conductor. A first one of the arched elements includes a tab that is insertable into and out of the first pocket of the first member. The first arched element is configured to engage the conductor and retain the first member in a fixed position relative to the conductor when at least one of the first member and the second member is movably deployed around the conductor. The second arched element includes a tab that is insertable into and out of the second pocket of the second member. The second arched element is configured to engage the conductor opposite the first arched element and retain the second member in a fixed position relative to the conductor and the first member when at least one of the first member and the second member is movably deployed around the conductor.

According to another exemplary embodiment, an apparatus for positioning and retaining a current transformer, such as a Rogowski coil, about a conductor includes two or more non-conductive fins and a zip tie. A first fin is configured to receive a first section of the Rogowski coil and includes a first fin body and a first bracket. The first fin body defines a first coil aperture and a first coupling mechanism aperture. The first coil aperture is positioned proximate an end of the first fin body furthest from the first bracket. The first coupling mechanism aperture is positioned proximate an end of the first fin body nearest the first bracket. The first coil aperture is further defined by one or more internal walls of the first fin body. Similarly, a second fin is configured to receive a second section of the Rogowski coil and includes a second fin body and a second bracket. The second fin body defines a second coil aperture and a second coupling mechanism aperture. The second coil aperture is positioned proximate an end of the second fin body furthest from the second bracket. The second coupling mechanism aperture is positioned proximate an end of the second fin body nearest the second bracket. The second coil aperture is further defined by one or more internal walls of the second fin body. The zip tie is positioned through at least the first coupling mechanism aperture and the second coupling mechanism aperture. The first bracket and the second bracket form at least part of a securing structure configured to engage the conductor and retain the first member and the second member in fixed positions relative to the conductor and to each other.

According to a further embodiment, the apparatus may include a third fin configured to receive a third section of the Rogowski coil. The third fin includes a third fin body and a third bracket. The third fin body defines a third coil aperture and a third coupling mechanism aperture. The third coil aperture is positioned proximate an end of the third fin body furthest from the third bracket. The third coupling mechanism aperture is positioned proximate an end of the third fin body nearest the third bracket. The third coil aperture is further defined by one or more internal walls of the third fin body. In this embodiment, the first bracket, the second bracket, and the third bracket form at least part of the securing structure.

According to another exemplary embodiment, a method is disclosed for securing a Rogowski coil symmetrically around or about a conductor, such as a distribution transformer power node. According to this embodiment, a first section of the Rogowski coil in positioned in a first retention structure of a first member of a multi-member apparatus. At least a second section of the Rogowski coil is positioned in at least a second retention structure of at least a second member of the multi-member apparatus. One or more members of the multi-member apparatus are then movably deployed relative to one another and to the conductor so as to position the Rogowski coil about the conductor when the multi-member apparatus is deployed. The multi-member apparatus is then secured to the conductor with an inner clamping structure of the multi-member apparatus. The inner clamping structure may have at least a first clamping element integrated with the first member and a second clamping element integrated with the second member. The first and second clamping elements physically oppose each other.

This Brief Summary has been provided to describe certain concepts in a simplified form that are further described in more detail in the Detailed Description. The Brief Summary does not limit the scope of the claimed subject matter, but rather the words of the claims themselves determine the scope of the claimed subject matter.

BRIEF DESCRIPTION OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which:

FIGS. 1A-1K depict various views of an exemplary apparatus for positioning and retaining a Rogowski coil about a conductor, in accordance with one embodiment of the present disclosure.

DETAILED DESCRIPTION

Figure 1C:
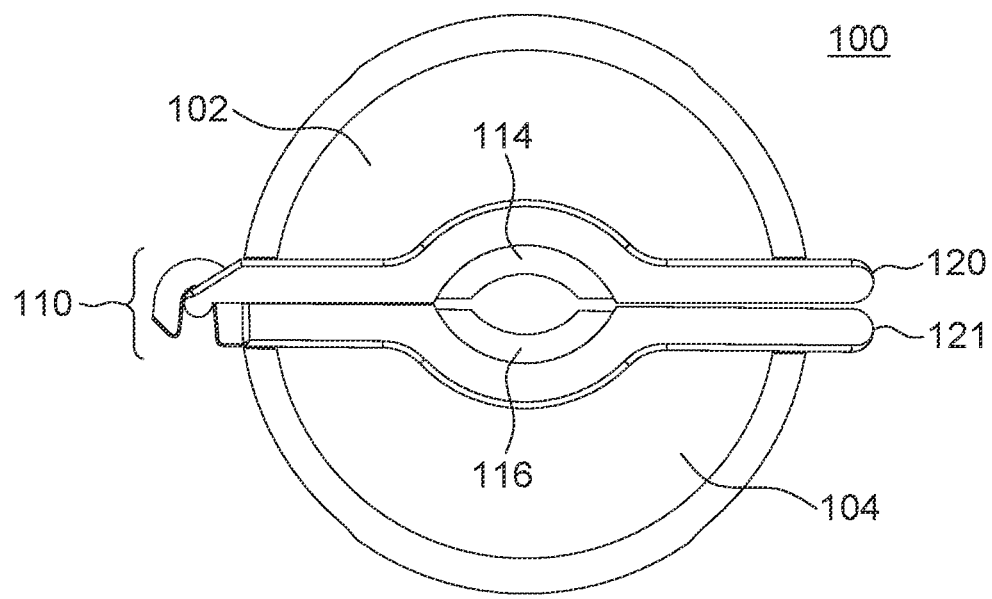
Figure 1D:
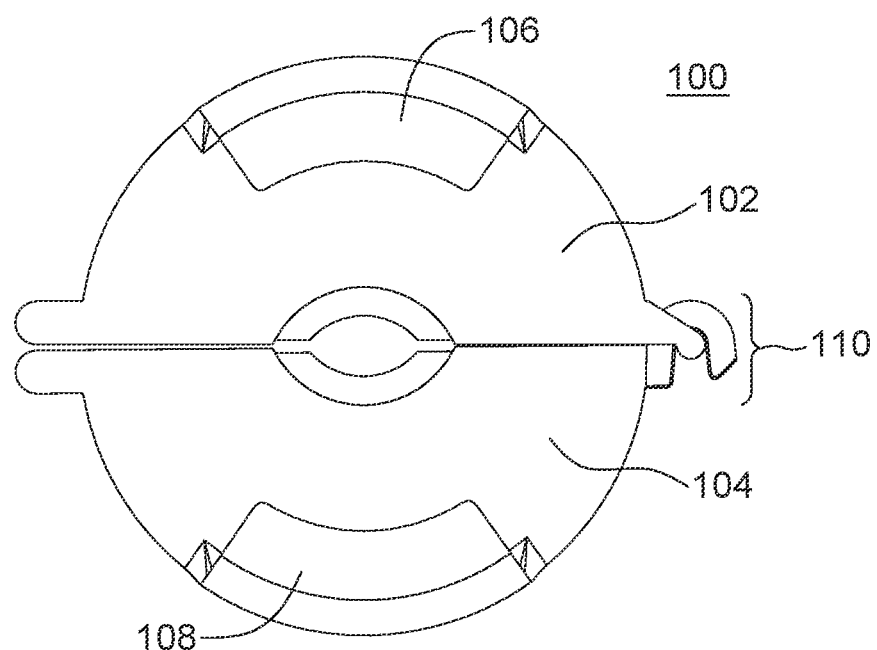
Figure 1E:
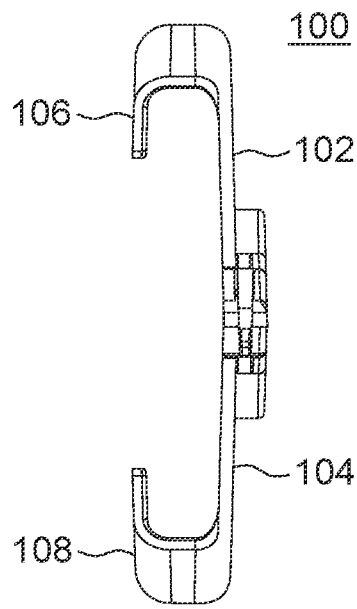
Figure 1F:
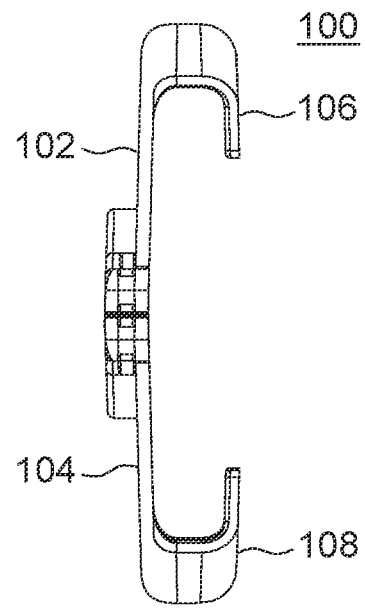
Figure 1G:
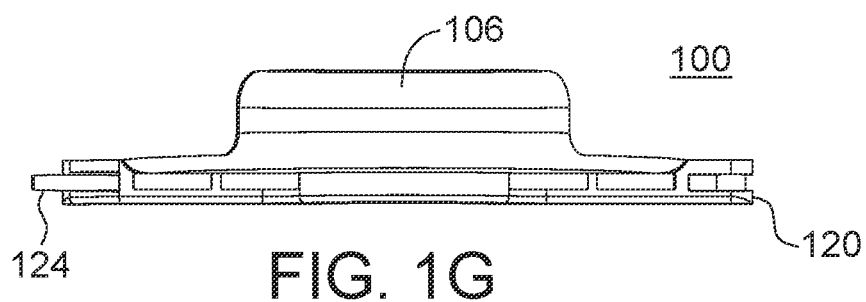
Figure 1H:
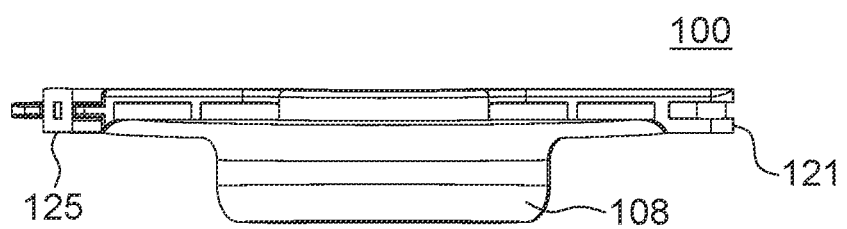

The present disclosure may be understood more readily by reference to this detailed description and the accompanying figures. The terminology used herein is for the purpose of describing specific embodiments only and is not limiting to the claims unless a court or accepted body of competent jurisdiction determines that such terminology is limiting. Unless specifically defined in the present disclosure, the terminology used herein is to be given its traditional meaning as known in the relevant art.

In the following description, certain specific details are set forth in order to provide a thorough understanding of various disclosed embodiments. However, one skilled in the relevant art will recognize that embodiments may be practiced without one or more of these specific details, or with other methods, components, materials, and the like. In other instances, certain structures associated with distribution transformers, Rogowski coils, current transformers (CTs), electronic monitors, and the like have not been shown or described in detail to avoid unnecessarily obscuring more detailed descriptions of the embodiments.

The device, method, and system embodiments described in this disclosure (i.e., the teachings of this disclosure) enable placement of one or more Rogowski coils or other current transformers on respective conductors, such as power nodes of a distribution transformer. The disclosure describes positioning and retention apparatus, including clamps, clamping methods, and other structures and acts, that enable a stability and rigidity of the Rogowski coil about the power node. The disclosure describes how to provide a substantially uniform radius from the center of the conductor (e.g., distribution transformer power node) to each section of the Rogowski coil.

FIGS. 1A-1K depict various views of one exemplary apparatus 100 for positioning and retaining a Rogowski coil about a conductor, such as a distribution transformer power node, in accordance with one embodiment of the present disclosure. To facilitate the present discussion, any one or more of FIGS. 1A-1K may be referred to individually or collectively as FIG. 1.

FIG. 1A is a top, front perspective view and FIG. 1B is a bottom, rear perspective view of the exemplary Rogowski coil positioning and retention apparatus 100. The apparatus 100 includes, inter alia, two or more members 102, 104 (two shown), a coupling mechanism 110, and a non-conductive securing structure 112. The first member 102 includes a first retention structure 106. The second member 104 includes a second retention structure 108. The first and second retention structures 106, 108 are sized, shaped, and otherwise configured to receive respective first and second sections of a Rogowski coil 201 (see FIGS. 2A, 2B, 3A, and 3B). For example, as illustrated in FIG. 1, the retention structures 106, 108 may be L-shaped or U-shaped brackets sized and shaped to accommodate the diameter of a particular Rogowski coil 201 to be retained. In some embodiments, the diameter of the Rogowski coil 201 to be retained by the positioning and retention apparatus 100 may be between about one-half inch (1.27 cm) and about two inches (5.08 cm).

When the apparatus 100 is deployed, the Rogowski coil 201 retained by the apparatus 100 has a desired, substantially constant radius around the conductor based on the characteristics of the retention structures 106, 108 and the members 102, 104 (e.g., rigidity, length, and so forth) so as to enable the Rogowski coil 201 to function properly taking into account the diameter of the conductor, the peak AC current being carried by the conductor, and other parameters as are known in the art.

The coupling mechanism 110, which may be a hinge, a flexible member, a movable bracket, an adhesive, a set of interlocking structures, or the like, is arranged to movably deploy the first and second members 102, 104 of the apparatus 100 relative to each other and around the conductor. For example, in the embodiment illustrated in FIG. 1, the coupling mechanism 110 is a hinge that includes a first hinge part 125 integrated with or attached to the first member 102 of the apparatus 100 and a second hinge part 124 integrated with or attached to the second member 104 of the apparatus 100, where the second hinge part 124 is configured to receive the first hinge part 125. In such an embodiment, a first part of the coupling mechanism 110 is integrated with or attached to the first member 102 of the apparatus 100, and a second part of the coupling mechanism 110 is integrated with or attached to the second member 104 of the apparatus 100.

The securing structure 112 illustrated in FIG. 1 includes a pair of arched elements 114, 116. The first arched element 114 may be constructed to be partially insertable into a void or pocket of the first member 102, and the second arched element 116 may be constructed to be partially insertable into a void or pocket of the second member 104 as illustrated in FIG. 1J. In this embodiment, each arched element 114, 116 includes a tab 130, 131 that is adjustably insertable into a guided mating pocket 133, 134 of its associated member 102, 104. Such a construction of the arched element 114, 116 allows the arched element to be adaptable to various diameters of conductors around which a Rogowski coil 201 may be employed. In one embodiment, the tabs 130, 131 of the arched elements 114, 116 and the mating pockets 133, 134 may be sized to facilitate engagement with conductors having diameters of about 0.25 in (0.63 cm) to about 3 in. (7.62 cm) or more, while enabling the apparatus 100 to close completely around the conductor. When the apparatus 100 with a dual arched element securing structure 112 is deployed to position and retain a Rogowski coil 201 about a conductor, the first arched element 114 engages the conductor and retains the first member 102 in a fixed position relative to the conductor, and the second arched element 116 engages the conductor and retains the second member 104 in a fixed position relative to the conductor.

According to one exemplary embodiment, the first and second securing structure elements 114, 116 become positioned physically opposite each other when moved with the coupling mechanism to retain the Rogowski coil 201 around the conductor. In such a case, the positioning and retention apparatus 100 functions as to clamp the Rogowski coil into position around the conductor (e.g., a distribution transformer power node). As a result, when the apparatus 100 is deployed in this embodiment, the first and second members 102, 104 together form a substantially disc-like shape.

In some embodiments, the positioning and retention apparatus 100 or portions thereof are formed substantially of plastic or a plastic-like material. For example, one or more of the portions, structures, members, or the like are formed of a strong, flexible, electrically non-conductive material. In other embodiments, the positioning and retention apparatus 100 or portions thereof are formed substantially of a ceramic or a ceramic-like material. For example, one or more of the portions, structures, members, or the like are formed from a ceramic material. In one exemplary embodiment, the first and second members 102, 104 of the positioning and retention apparatus 100 are formed substantially of plastic, and the first and second securing structure elements 114, 116 are formed substantially of a ceramic material. In other alternative embodiments, some or all portions of the positioning and retention apparatus 100 are made of a composite material.

Optionally, the positioning and retention apparatus 100 includes a binding mechanism 118. The binding mechanism 118 may include a clip, tab, zip tie, bracket, block, locking structure, adhesive, or the like. In at least one exemplary embodiment, the coupling mechanism 110 of the positioning and retention apparatus 100 is a hinge and the binding mechanism 118 is a pair of tabs and a zip tie. In such as case, the coupling mechanism 110 may include a first part 125 of its hinge integrated into the first member 102 of the apparatus 100 and a second part 124 of the hinge integrated into the second member 104 of the apparatus. Additionally, the binding mechanism 118 may include a first tab 120 integrated into the first member 102 of the apparatus 100 and a second tab 121 integrated into the second member 104 of the apparatus 100. In this embodiment, when the apparatus 100 is deployed, the first and second members 102, 104 rotate about the coupling mechanism hinge such that the securing structure 112 physically contacts the conductor (e.g., distribution transformer power node). Subsequently, the binding mechanism's zip tie or other securing implement is used to permanently or semi-permanently lock, secure, or bind the tabs 120, 121 of the binding mechanism 118 together, thereby binding the first and second members 102, 104 together and retaining the securing structure 112 around the conductor.

In some embodiments, a Rogowski coil positioning and retention apparatus 100 may be sized to clamp around or about a distribution transformer power node 405 (see FIG. 4B) having a diameter of one-quarter inch (0.25 in), one-half inch (0.5 in.), three-quarter inch (0.75 in.), one inch (1.0 in.), or some other diameter. In other embodiments, the Rogowski coil positioning and retention apparatus 100 may be sized to clamp around or about a distribution transformer power node 405 having a diameter of between about one inch (2.54 cm) and about three inches (7.62 cm). Other diameters of distribution transformer power nodes or conductors are contemplated. Accordingly, it is recognized that a single positioning and retention apparatus 100 may be used to position and retain a Rogowski coil 201 about a wide range of distribution transformer power nodes of different sizes. One of skill in the art will recognize that use of the word "diameter" is not limiting. For example, in cases where a conductor (e.g., distribution transformer power node) is not cylindrical (e.g., having a cross-section that has a circle shape), the use of the word diameter may be replaced by one or more other cross-section related terms, such as diagonal, length, width, and so forth. Accordingly, the Rogowski coil positioning and retention apparatus 100 of the present disclosure may be used to position and retain a Rogowski coil 201 to a conductor having a cross-section of any geometry, such as a square, a rectangle, an oval, a triangle, or some other shape or irregular form.

Figure 1I:
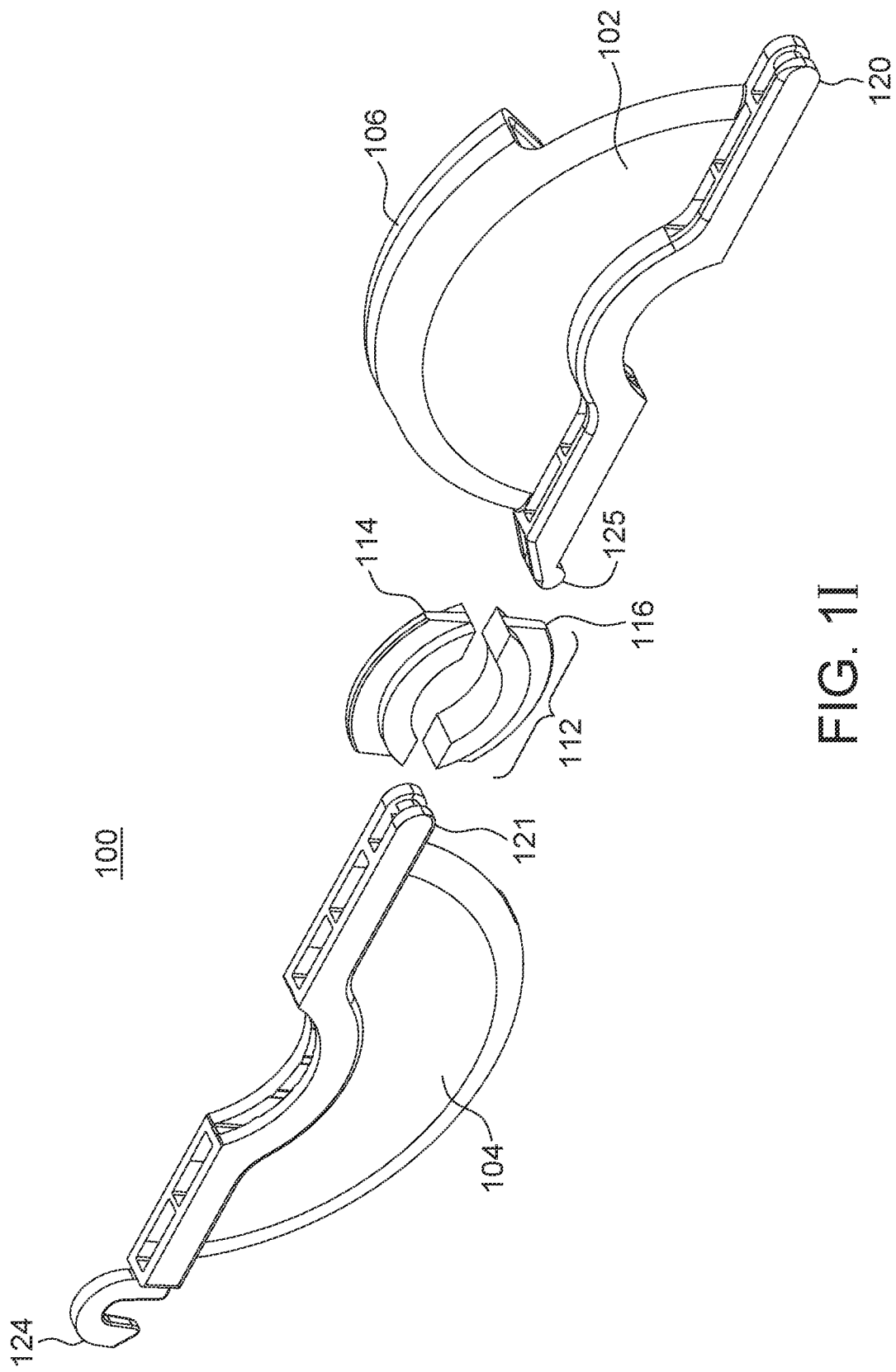
Figure 1K:
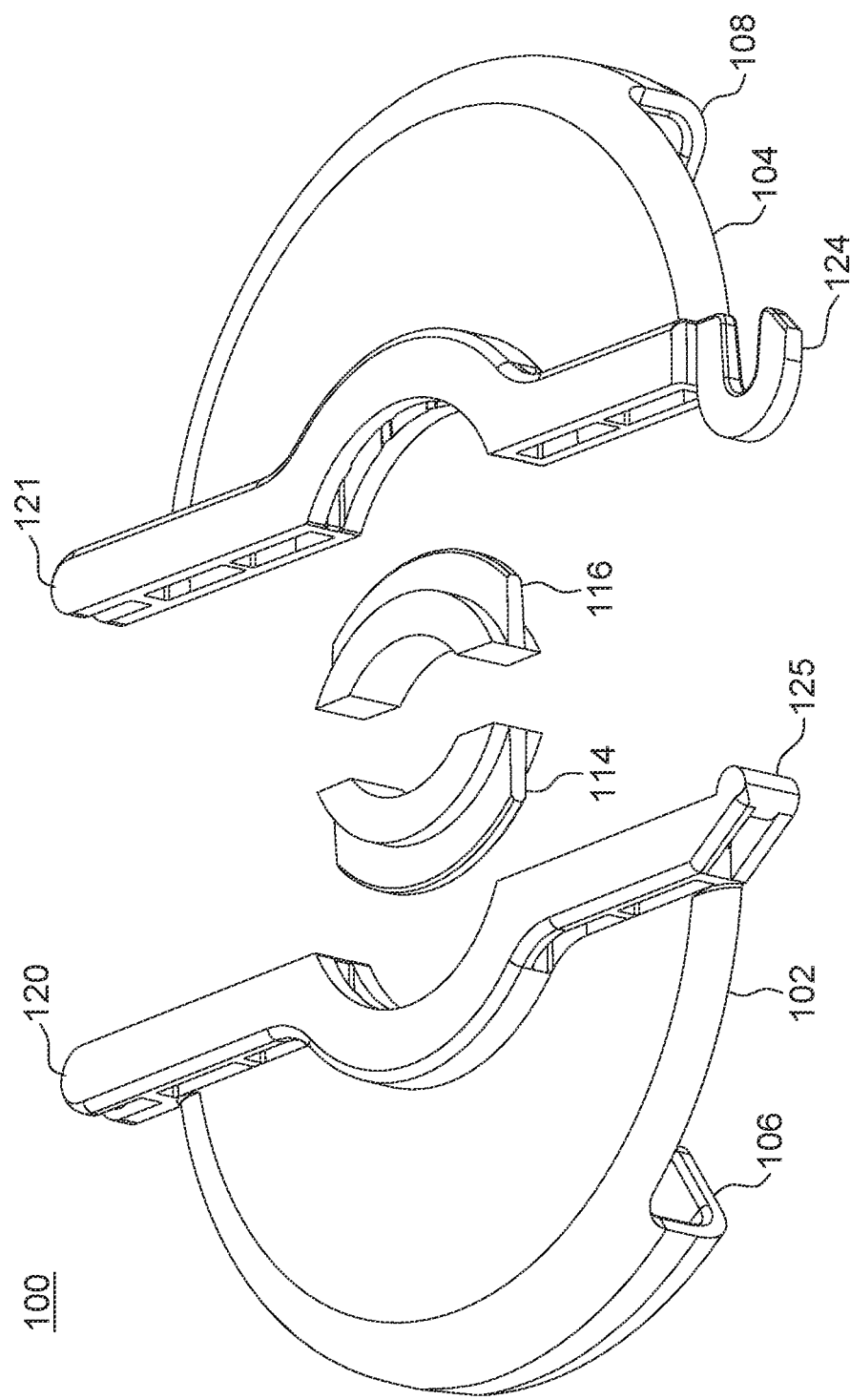

FIGS. 1C-1H are, respectively, a front view, rear view, left view, right view, top view, and bottom view of the Rogowski coil positioning and retention apparatus 100. FIGS. 1I, 1J, and 1K are, respectively, three different exploded views of the Rogowski coil positioning and retention apparatus 100.

Figure 2A:
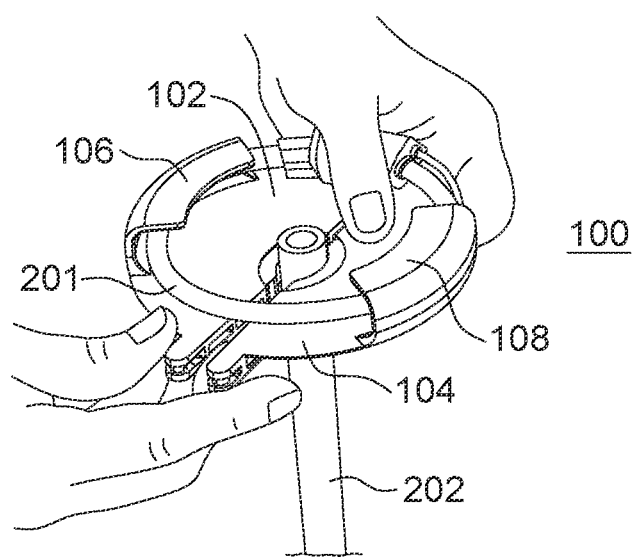
FIGS. 2A-2B illustrate use of the apparatus of FIG. 1 to position and retain a flexible Rogowski coil about a simulated distribution transformer power node of a first size, in accordance with an alternative embodiment of the present disclosure.
Figure 2B:
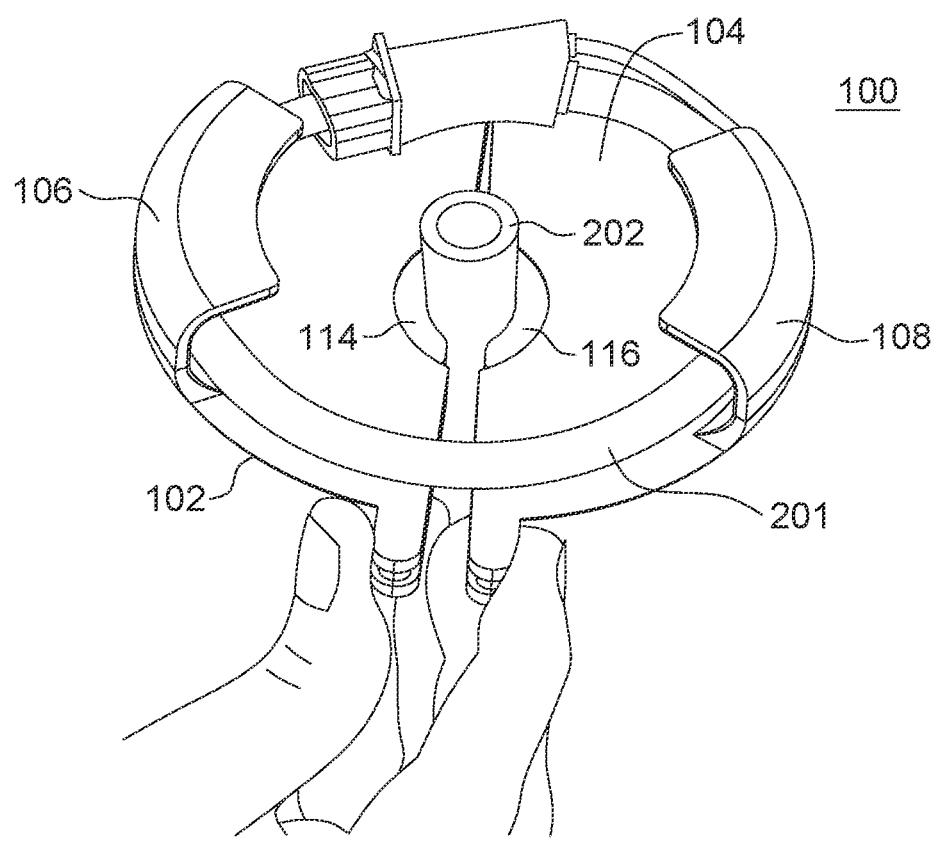
Figure 3A:
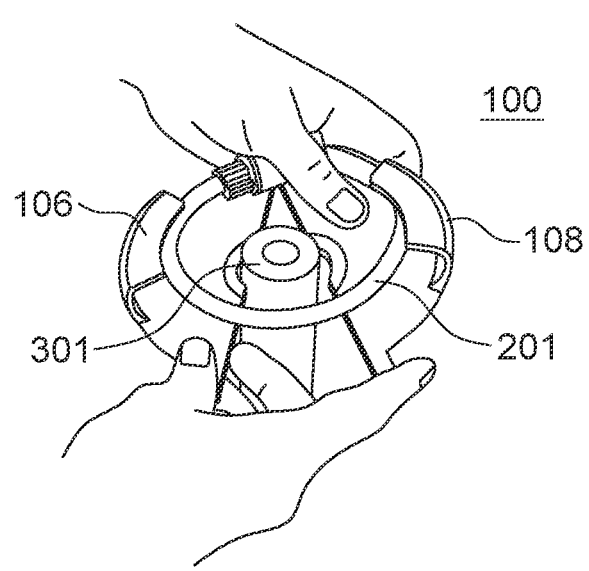
FIGS. 3A-3B illustrate use of the apparatus of FIG. 1 to position and retain a flexible Rogowski coil about a simulated distribution transformer power node of a second size, in accordance with another alternative embodiment of the present disclosure.
Figure 3B:
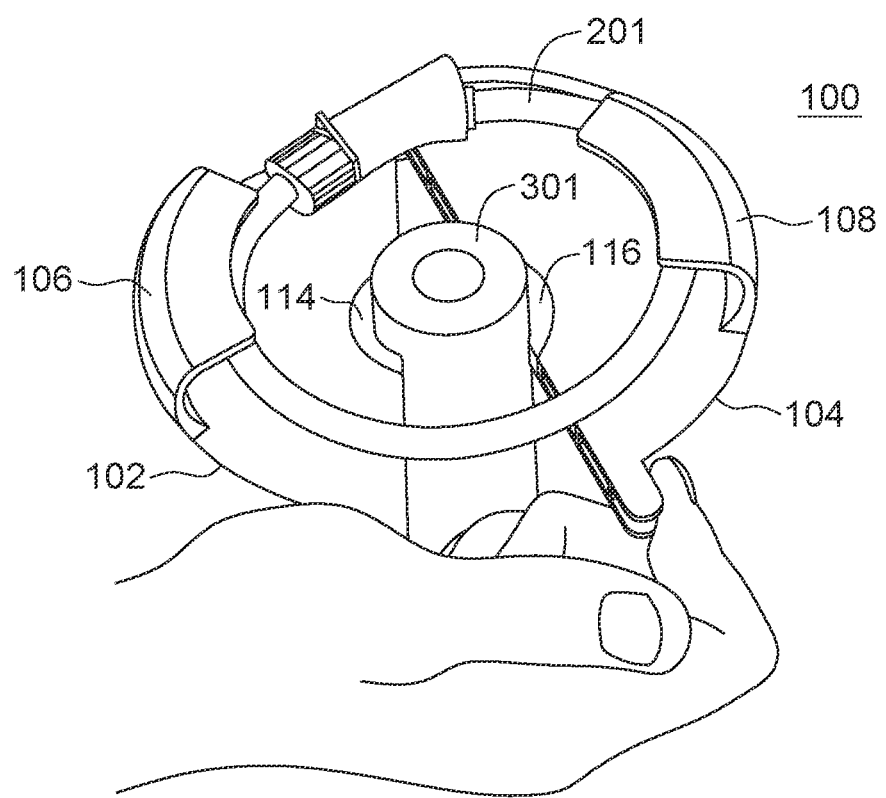

FIGS. 2A-2B illustrate use of the positioning and retention apparatus 100 of FIG. 1 to mechanically position and retain a flexible Rogowski coil 201 about or around a conduit pipe 202 simulating a distribution transformer power node 405 (see FIG. 4B) of a first size, in accordance with an alternative embodiment of the present disclosure. FIGS. 3A-3B illustrate use of the apparatus 100 of FIG. 1 to mechanically position and retain a flexible Rogowski coil 201 about or around a larger sized conduit pipe 301 simulating a distribution transformer power node of a second size, in accordance with another alternative embodiment of the present disclosure. As shown in FIG. 2B, after the coupling mechanism 110 deploys the first member 102 relative to the second member 104 and around the conductor, the first retention structure 106 and the second retention structure 108 are positioned so as to face each other. The size of a conductor, such as a distribution transformer power node, may be determined by the size of the conductor's outside diameter. In at least some cases, the size of a conductor may range from an outside diameter of one-half inch (1.27 cm) to an outside diameter of one inch (2.54 cm) or more.

Figure 4B:
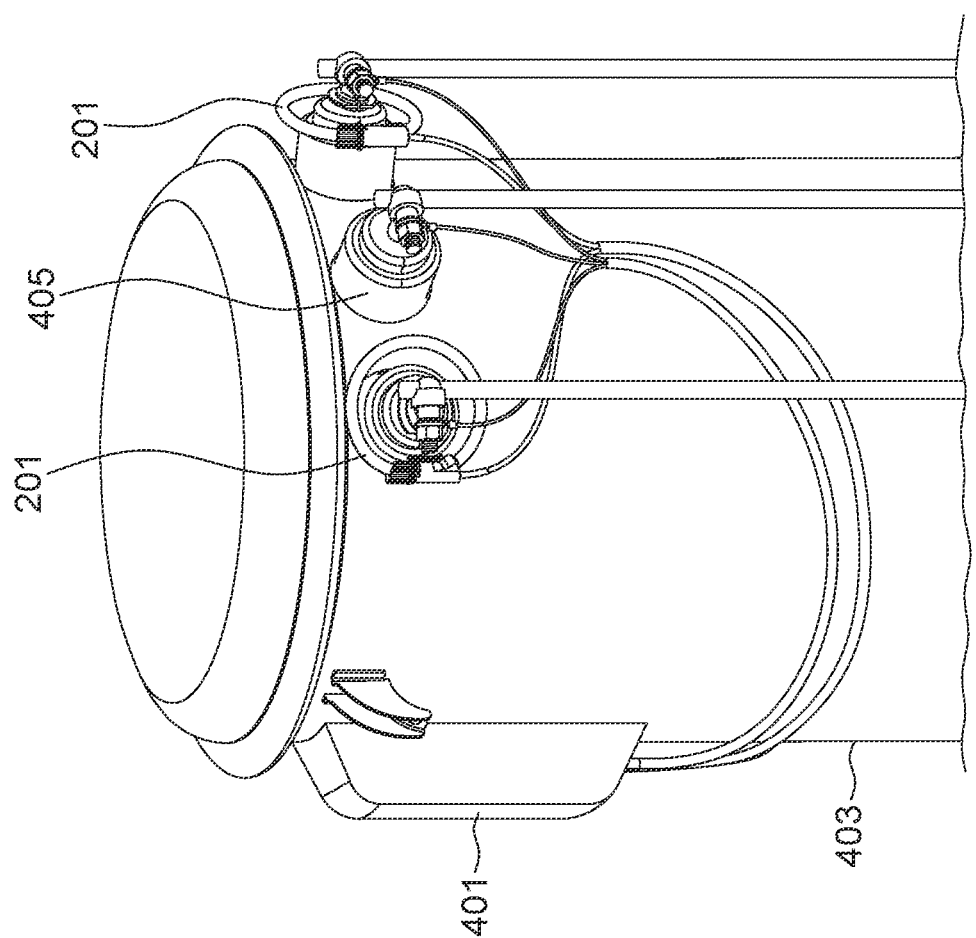
FIGS. 4A-4B illustrate an exemplary transformer monitor system in which an apparatus for positioning and retaining a Rogowski coil about a conductor may be used to secure one or more Rogowski coils about power nodes of a distribution transformer, in accordance with another alternative embodiment of the present disclosure.
Figure 4A:
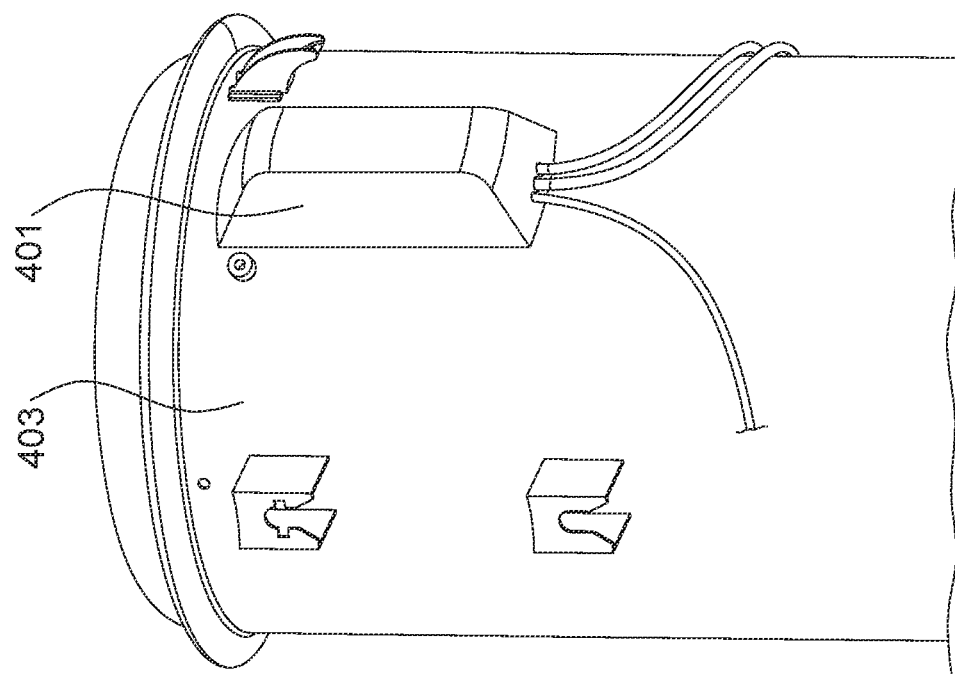

FIGS. 4A and 4B illustrate an exemplary transformer monitor system in which an apparatus 100 for positioning and retaining a Rogowski coil 201 about a conductor may be used to secure one or more Rogowski coils 201 about power nodes 405 of a distribution transformer 403, in accordance with another alternative embodiment of the present disclosure. In this case, the transformer monitor system includes a transformer monitor 401 electromechanically coupled to a distribution transformer 403. Two Rogowski coils 201 are positioned about respective distribution transformer power nodes 405. The outputs of the Rogowski coils 405 are routed back to the transformer monitor 401 for complete or partial processing (e.g., integration and conversion into data to be reported, or integration and then analysis versus various thresholds, with the results of the analysis to be reported) and reporting to a backend (e.g., cloud) server. To avoid unnecessarily obfuscating FIG. 4B, only one distribution power transformer node 405 is identified by a reference numeral; however, three exemplary distribution transformer power nodes 405 are illustrated.

The positioning and retention apparatus 100 of FIG. 1 may be used to mechanically position and retain each Rogowski coil 201 about a respective distribution transformer power node 405. To avoid unnecessarily obfuscating FIG. 4B, the positioning and retention apparatus 100, 500 that would be used with each Rogowski coil 201 is not shown, but one of ordinary skill in the art will recognize how such an apparatus 100, 500 may be used to retain a Rogowski coil 201 about its respective distribution transformer power node 405 based on the description of FIGS. 1-3 above and FIG. 5 below.

Figure 5A:
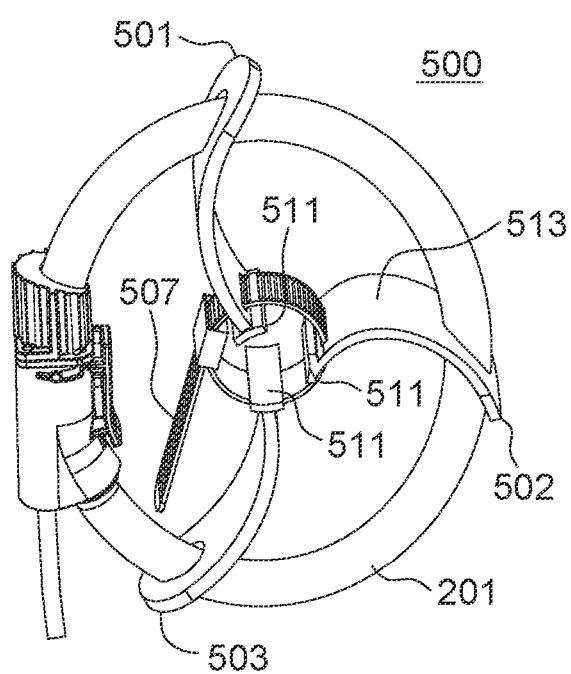
FIGS. 5A-5G depict various views of a second exemplary apparatus for positioning and retaining a Rogowski coil about a conductor, in accordance with another embodiment of the present disclosure.
Figure 5B:
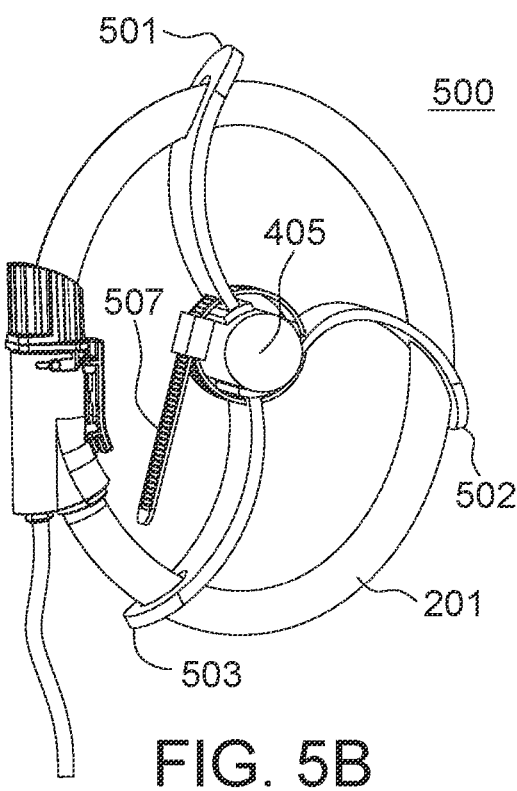
Figure 5C:
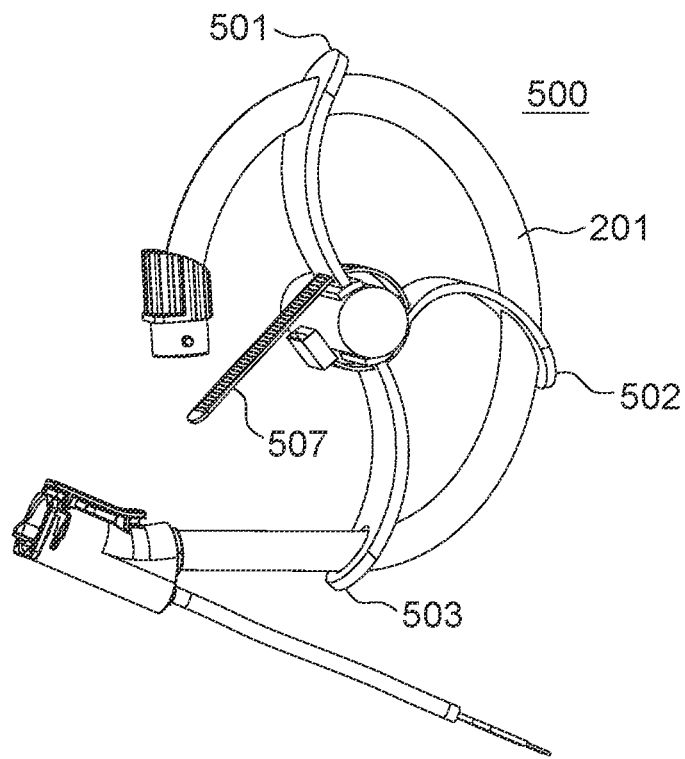
Figure 5D:
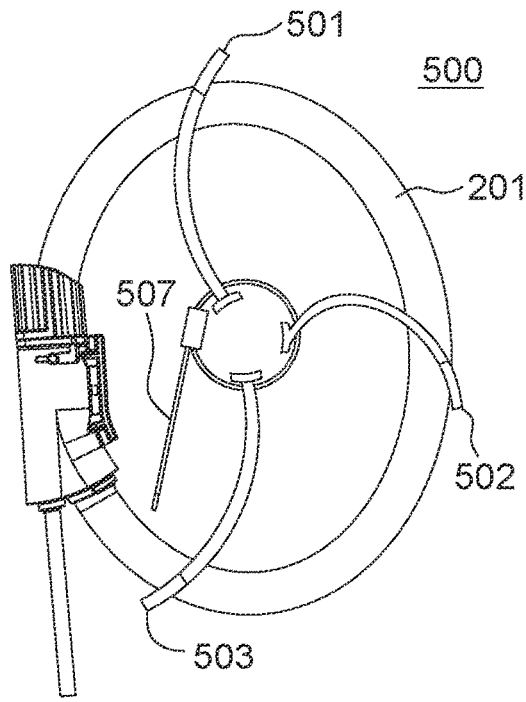
Figure 5E:
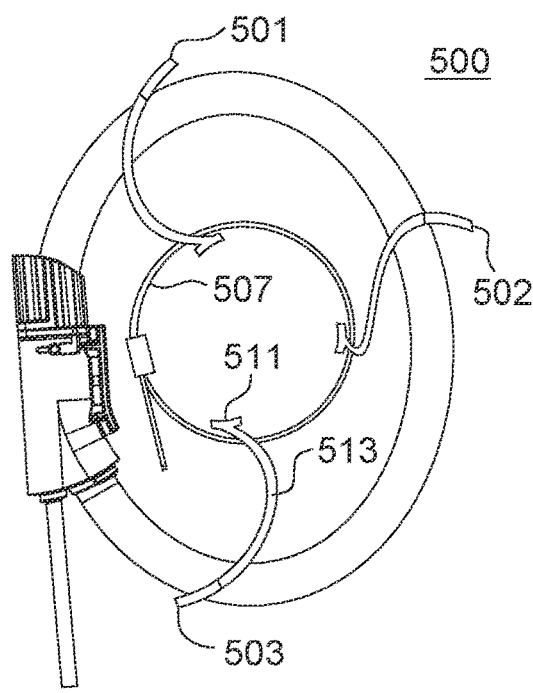
Figure 5F:
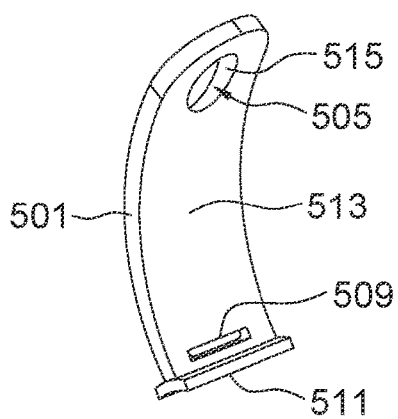
Figure 5G:
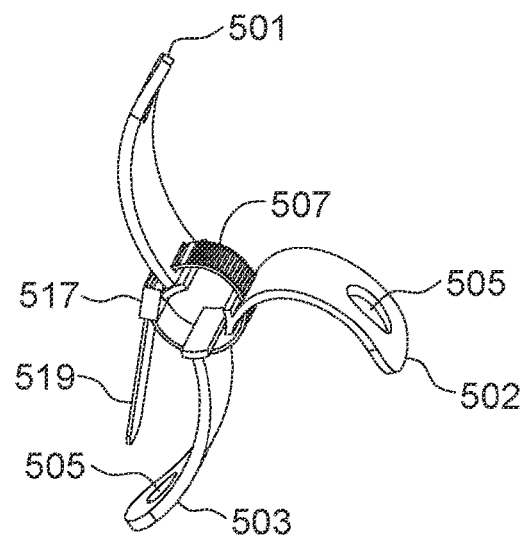

FIGS. 5A-5G (collectively referred to as FIG. 5) depict various views of a second exemplary apparatus 500 for positioning and retaining a Rogowski coil 201 about a conductor, in accordance with another embodiment of the present disclosure. According to this embodiment, the retention apparatus 500 includes a plurality of flexible fins 501-503 (three shown, although only two or more are necessary) and a coupling mechanism 507. As shown in FIG. 5F, each fin 501-503 includes a body 513 connected at one end to a non-conductive bracket 511. The fin bracket 511 may be molded with the fin body 513 or separately attached (e.g., by welding or otherwise) to the fin body 513. For example, the fin body 513 and the bracket 511 may be made of rubber, plastic, or other non-conductive materials. The fin body 513 defines a coil aperture 505 proximate the end of the body 513 furthest from the bracket 511 and a coupling mechanism aperture 509 proximate the end of the body 513 nearest the bracket 511. The thickness of the fin body 513 at the location of the coil aperture 505 defines the height or depth of the internal wall(s) 515 defining the coil aperture 505. Similarly, the thickness of the fin body 513 at the location of the coupling mechanism aperture 509 defines the height or depth of the wall(s) defining the coupling mechanism aperture 509. Where the thickness of the fin body 513 is uniform or approximately uniform, the heights or depths of the walls of the coil and coupling mechanism apertures 505, 509 are equivalent or approximately equivalent.

According to this embodiment, the internal wall(s) 515 of the coil aperture 505 in the fin body 513 forms a retention structure configured to receive and support the section of the Rogowski coil 201 which passes through the coil aperture 505. Similarly, the wall(s) of the coupling mechanism aperture 509 in the fin body 513 forms a retention structure configured to receive and support the section of the coupling mechanism 507 which passes through the coupling mechanism aperture 509.

The coupling mechanism 507, which may be a zip tie (or equivalently, a cable tie or a tie wrap) as illustrated in FIG. 5, is arranged to movably deploy the fins 501-503 relative to each other and around the conductor (e.g., a distribution transformer power node 405). Portions of the coupling mechanism 507, in this embodiment, may pass through appropriately sized apertures 509 in the fins 501-503 to facilitate movement of the fins 501-503 about the conductor.

In this embodiment, the brackets 511 of the fins 501-503 collectively form a securing structure configured to engage the conductor and retain the fins 510-503 in fixed positions relative to the conductor and to each other. As the coupling mechanism 507 (e.g., zip tie) is adjusted (e.g., tightened), the brackets 511 are pulled closer to the conductor until they engage the conductor to retain the fins 501-503 and the Rogowski coil 201 in fixed positions relative to the conductor. When the embodiment of the positioning and retention apparatus 500 illustrated in FIG. 5 is used, the Rogowski coil 201 retained by the apparatus 500 may be set to have a desired, substantially constant radius around the conductor based on the characteristics of the fins 501-503 (e.g., rigidity, length, and so forth) so as to enable the Rogowski coil 201 to function properly taking into account the diameter of the conductor, the peak AC current being carried by the conductor, and other parameters as are known in the art.

To use the positioning and retaining apparatus 500 as illustrated in FIG. 5, a Rogowski coil 201 is opened (if previously closed) and one end of the coil 201 (preferably the smaller diameter end) is passed through the coil aperture 505 in the body 513 of each fin 501-503 used to form the apparatus 500. Additionally, a strap portion 519 of the coupling mechanism 507 is passed through the coupling mechanism aperture 509 in the body 513 of each fin 510-503. One of ordinary skill in the art will readily recognize and appreciate that the order of passing the Rogowski coil 201 and the coupling mechanism 507 through their respective apertures 505, 509 of each fin body 513 may be reversed such that the strap portion 519 of the coupling mechanism 507 is passed through the coupling mechanism aperture 509 in the body 513 of each fin 510-503 before an end of the Rogowski coil 201 is passed through the coil aperture 505 in the body 513 of each fin 501-503.

A head end 517 of the coupling mechanism 507 is then secured to the strap portion 519 of the coupling mechanism 507 to form a loose loop. The loose loop is then positioned around or about the conductor (e.g., a distribution transformer power node 405) and the strap portion 517 of the coupling mechanism 507 is pulled so as to cause the securing structure of the apparatus 500 (formed from the brackets 511 of the fins 501-503) to engage the conductor (e.g., the metal conduit or its insulation) and retain the fins 501-503 in fixed positions relative to the conductor and to each other.

Figure 6:
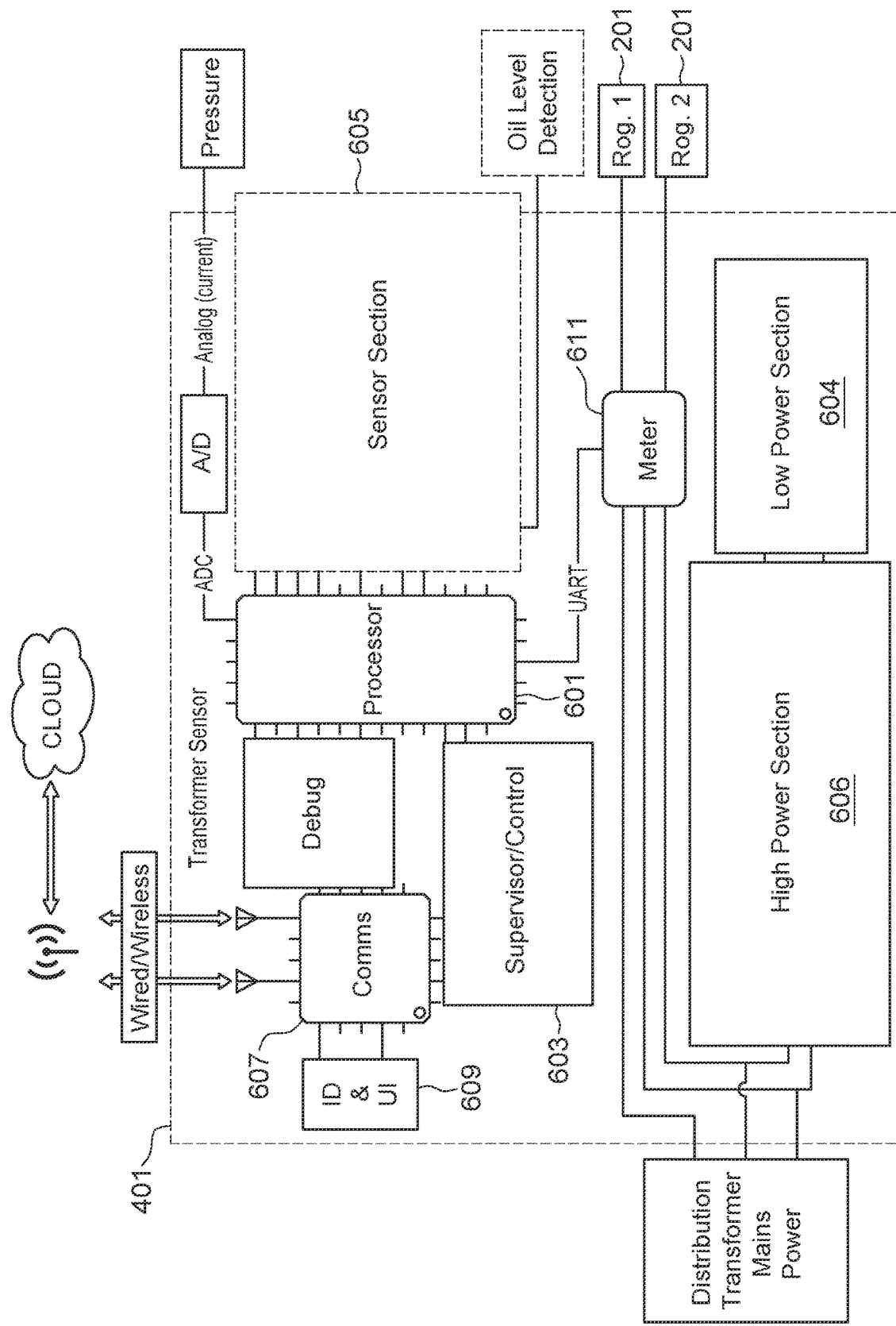
FIG. 6 is an electrical block diagram of an exemplary distribution transformer monitor with which one or more Rogowski coils and associated positioning apparatus may be used, in accordance with a further embodiment of the present disclosure.

FIG. 6 is an electrical block diagram of an exemplary distribution transformer monitor 401 with which one or more Rogowski coils 201 and associated positioning and retention apparatus 100, 500 may be used, in accordance with a further embodiment of the present disclosure. The distribution transformer monitor 401 includes, inter alia, a processor 601, a supervisor/control section 603 (e.g., memory arranged to store executable software instructions, data, and the like), a sensor section 605, one or more power sections 604, 606 (a low power section 604 and a high power section 606 being shown), communications facilities 607, identification and user interface sections 609, and a metering section 611. As indicated by its dashed lines, some or all portions of the sensor section 605 may be arranged inside a housing of the distribution transformer monitor 401, partially inside and partially outside the housing of the distribution transformer monitor 401, or completely outside the housing of the distribution transformer monitor 401.

In operation, analog output from each Rogowski coil 201 is supplied to the metering section 611 of the distribution transformer monitor 401, which performs certain operations, such as integration of the Rogowski coil output, analog-to-digital conversion of the resulting integration, and generation of a bit stream for communicating its digital output to the processor 601 using a selected data communication protocol, such as the universal asynchronous receiver/transmitter (UART) communication protocol. The processor 601 may perform certain analysis on the data received from the metering section 611 in order to assess a condition of the distribution transformer 403 based on the output of the Rogowski coil(s) 201 and then communicate the result of that analysis to the backend (cloud) server via the communications facilities 607. Alternatively, the processor 601 may generate an appropriate signal for use by the communications facilities 607 to simply communicate the output of the metering section 611 to the backend server for analysis there.

Having now set forth certain embodiments, further clarification of certain terms used herein may be helpful to providing a more complete understanding of that which is considered inventive in the present disclosure.

In the embodiments of present disclosure, one or more particular Rogowski coil clamps are illustrated and described. The various components and devices of the embodiments are interchangeably described herein as "coupled," "connected," "attached," and the like. It is recognized that once assembled, the system provides the benefits as described in the present disclosure. The materials and the junctions formed at the point where two or more structures meet in the present embodiments may or may not be joined mechanically, electrically, or otherwise industrially acceptable level.

The figures in the present disclosure illustrate portions of one or more non-limiting computing device embodiments such as one or more components of a distribution transformer monitor. The computing devices may include operative hardware found in conventional computing device apparatuses such as one or more processors, volatile and non-volatile memory, serial and parallel input/output (I/O) circuitry compliant with various standards and protocols, wired and/or wireless networking circuitry (e.g., a communications transceiver), one or more user interface (UI) modules, logic, and other electronic circuitry.

Processing devices, or "processors," as described herein, include central processing units (CPU's), microcontrollers (MCU), digital signal processors (DSP), application specific integrated circuits (ASIC), peripheral interface controllers (PIC), state machines, and the like. Accordingly, a processor as described herein includes any device, system, or part thereof that controls at least one operation, and such a device may be implemented in hardware, firmware, or software, or some combination of at least two of the same. The functionality associated with any particular processor may be centralized or distributed, whether locally or remotely. Processors may interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, one or more embodiments describe software executable by the processor, which when executed, carries out one or more of the method acts.

The present application discusses several embodiments that include or otherwise cooperate with one or more computing devices. It is recognized that these computing devices are arranged to perform one or more algorithms to implement various concepts taught herein. Each of said algorithms is understood to be a finite sequence of steps for solving a logical or mathematical problem or performing a task. Any or all of the algorithms taught in the present disclosure may be demonstrated by formulas, flow charts, data flow diagrams, narratives in the specification, and other such means as evident in the present disclosure. Along these lines, the structures to carry out the algorithms disclosed herein include at least one processing device executing at least one software instruction retrieved from at least one memory device. The structures may, as the case may be, further include suitable input circuits known to one of skill in the art (e.g., keyboards, buttons, memory devices, communication circuits, touch screen inputs, and any other integrated and peripheral circuit inputs (e.g., accelerometers, thermometers, light detection circuits and other such sensors)), suitable output circuits known to one of skill in the art (e.g., displays, light sources, audio devices, tactile devices, control signals, switches, relays, and the like), and any additional circuits or other structures taught in the present disclosure. To this end, every invocation of means or step plus function elements in any of the claims, if so desired, will be expressly recited.

As known by one skilled in the art, a computing device has one or more memories, and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. The memory in some cases is a non-transitory computer medium configured to store software instructions arranged to be executed by a processor. Some or all of the stored contents of a memory may include software instructions executable by a processing device to carry out one or more particular acts.

The computing devices illustrated herein may further include operative software found in a conventional computing device such as an operating system or task loop, software drivers to direct operations through I/O circuitry, networking circuitry, and other peripheral component circuitry. In addition, the computing devices may include operative application software such as network software for communicating with other computing devices, database software for building and maintaining databases, and task management software where appropriate for distributing the communication and/or operational workload amongst various processors. In some cases, the computing device is a single hardware machine having at least some of the hardware and software listed herein, and in other cases, the computing device is a networked collection of hardware and software machines working together in a server farm to execute the functions of one or more embodiments described herein. Some aspects of the conventional hardware and software of the computing device are not shown in the figures for simplicity.

Amongst other things, the exemplary computing devices of the present disclosure may be configured in any type of mobile or stationary computing device such as a remote cloud computer, a computing server, a smartphone, a tablet, a laptop computer, a wearable device (e.g., eyeglasses, jacket, shirt, pants, socks, shoes, other clothing, hat, helmet, other headwear, wristwatch, bracelet, pendant, other jewelry), vehicle-mounted device (e.g., train, plane, helicopter, unmanned aerial vehicle, unmanned underwater vehicle, unmanned land-based vehicle, automobile, motorcycle, bicycle, scooter, hover-board, other personal or commercial transportation device), industrial device (e.g., factory robotic device, home-use robotic device, retail robotic device, office-environment robotic device), or the like. Accordingly, the computing devices include other components and circuitry that is not illustrated, such as, for example, a display, a network interface, memory, one or more central processors, camera interfaces, audio interfaces, and other input/output interfaces. In some cases, the exemplary computing devices may also be configured in a different type of low-power device such as a mounted video camera, an Internet-of-Things (IoT) device, a multimedia device, a motion detection device, an intruder detection device, a security device, a crowd monitoring device, or some other device.

When so arranged as described herein, each computing device may be transformed from a generic and unspecific computing device to a combination device arranged comprising hardware and software configured for a specific and particular purpose such as to provide a determined technical solution. When so arranged as described herein, to the extent that any of the inventive concepts described herein are found by a body of competent adjudication to be subsumed in an abstract idea, the ordered combination of elements and limitations are expressly presented to provide a requisite inventive concept by transforming the abstract idea into a tangible and concrete practical application of that abstract idea.

The embodiments described herein may use computerized technology to improve the technology of and related to Rogowski coils and distribution transformer monitors, but other techniques and tools remain available to position Rogowski coils and read information they produce. Therefore, the claimed subject matter does not foreclose the whole or even substantial Rogowski coil and distribution transformer monitor technological areas. The innovation described herein uses both new and known building blocks combined in new and useful ways along with other structures and limitations to create something more than has heretofore been conventionally known. The embodiments improve on computing systems which, when un-programmed or differently programmed, cannot perform or provide the specific acts to collect or process the Rogowski coil and distribution transformer monitor features claimed herein. The embodiments described in the present disclosure improve upon known Rogowski coil and distribution transformer monitor processes and techniques. The computerized acts described in the embodiments herein are not purely conventional and are not well understood. Instead, the acts are new to the industry. Furthermore, the combination of acts as described in conjunction with the present embodiments provides new information, motivation, and business results that are not already present when the acts are considered separately. There is no prevailing, accepted definition for what constitutes an abstract idea. To the extent the concepts discussed in the present disclosure may be considered abstract, the claims present significantly more tangible, practical, and concrete applications of said allegedly abstract concepts. And said claims also improve previously known computer-based systems that perform Rogowski coil and distribution transformer monitor operations.

Software may include a fully executable software program, a simple configuration data file, a link to additional directions, or any combination of known software types. When a computing device updates software, the update may be small or large. For example, in some cases, a computing device downloads a small configuration data file to as part of software, and in other cases, a computing device completely replaces most or all of the present software on itself or another computing device with a fresh version. In some cases, software, data, or software and data is encrypted, encoded, and/or otherwise compressed for reasons that include security, privacy, data transfer speed, data cost, or the like.

Database structures, if any are present in the distribution transformer monitor systems described herein, may be formed in a single database or multiple databases. In some cases, hardware or software storage repositories are shared amongst various functions of the particular system or systems to which they are associated. A database may be formed as part of a local system or local area network. Alternatively, or in addition, a database may be formed remotely, such as within a distributed "cloud" computing system, which would be accessible via a wide area network or some other network.

Input/output (I/O) circuitry and user interface (UI) modules include serial ports, parallel ports, universal serial bus (USB) ports, IEEE 802.11 transceivers and other transceivers compliant with protocols administered by one or more standard-setting bodies, displays, projectors, printers, keyboards, computer mice, microphones, micro-electro-mechanical (MEMS) devices such as accelerometers, and the like.

In at least one embodiment, devices such as the distribution transformer monitor or its constituent parts may communicate with other devices via communication over a network. The network may involve an Internet connection or some other type of local area network (LAN) or wide area network (WAN). Non-limiting examples of structures that enable or form parts of a network include, but are not limited to, an Ethernet, twisted pair Ethernet, digital subscriber loop (DSL) devices, wireless LAN, Wi-Fi, Worldwide Interoperability for Microwave Access (WiMax), or the like.

In the present disclosure, memory may be used in one configuration or another. The memory may be configured to store data. In the alternative or in addition, the memory may be a non-transitory computer readable medium (CRM). The CRM is configured to store computing instructions executable by a processor of the distribution transformer monitor. The computing instructions may be stored individually or as groups of instructions in files. The files may include functions, services, libraries, and the like. The files may include one or more computer programs or may be part of a larger computer program. Alternatively, or in addition, each file may include data or other computational support material useful to carry out the computing functions of a distribution transformer monitor system that has at least one Rogowski coil electrically coupled thereto.

Buttons, keypads, computer mice, memory cards, serial ports, bio-sensor readers, touch screens, and the like may individually or in cooperation be useful to a user operating the distribution transformer monitor and Rogowski coil system. The devices may, for example, input control information into the system. Displays, printers, memory cards, LED indicators, temperature sensors, audio devices (e.g., speakers, piezo device, etc.), vibrators, and the like are all useful to present output information to the user operating the distribution transformer monitor and Rogowski coil system. In some cases, the input and output devices are directly coupled to the distribution transformer monitor and electronically coupled to a processor or other operative circuitry. In other cases, the input and output devices pass information via one or more communication ports (e.g., RS-232, RS-485, infrared, USB, etc.).

As described herein, for simplicity, a user may in some cases be described in the context of the male gender. It is understood that a user can be of any gender, and the terms "he," "his," and the like as used herein are to be interpreted broadly inclusive of all known gender definitions. As the context may require in this disclosure, except as the context may dictate otherwise, the singular shall mean the plural and vice versa; all pronouns shall mean and include the person, entity, firm or corporation to which they relate; and the masculine shall mean the feminine and vice versa.

The terms, "real-time" or "real time," as used herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds or milliseconds), and that the activity may be performed on an ongoing basis (e.g., collecting data from a Rogowski coil, processing such data, and/or delivering such data to another computing device). An example of an activity that is not real-time is one that occurs over an extended period of time (e.g., hours or days) or that occurs based on intervention or direction by a user or other activity.

In the absence of any specific clarification related to its express use in a particular context, where the terms "substantial" or "about" in any grammatical form are used as modifiers in the present disclosure and any appended claims (e.g., to modify a structure, a dimension, a measurement, or some other characteristic), it is understood that the characteristic may vary by up to 30 percent. For example, a Rogowski coil positioning and retention apparatus may be described as being formed or otherwise oriented "substantially vertical," In these cases, an apparatus that is oriented exactly vertical is oriented along a "Z" axis that is normal (i.e., 90 degrees or at right angle) to a plane formed by an "X" axis and a "Y" axis. Different from the exact precision of the term, "vertical," the use of "substantially" to modify the characteristic permits a variance of the "vertical" characteristic by up to 30 percent. Accordingly, a Rogowski coil positioning and retention apparatus that is oriented "substantially vertical" includes an apparatus oriented between 63 degrees and 117 degrees. A Rogowski coil positioning and retention apparatus that is oriented at 45 degrees of an X-Y plane, however, is not mounted "substantially vertical." As another example, a Rogowski coil positioning and retention apparatus having a particular linear dimension of "between about three (3) inches and five (5) inches" includes such apparatus in which the linear dimension varies by up to 30 percent. Accordingly, the linear dimension of the apparatus may be between one and one-half (1.5) inches and six and one-half (6.5) inches.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

In the present disclosure, when an element (e.g., component, circuit, device, apparatus, structure, layer, material, or the like) is referred to as being "on," "coupled to," or "connected to" another element, the elements can be directly on, directly coupled to, or directly connected to each other, or intervening elements may be present. In contrast, when an element is referred to as being "directly on," "directly coupled to," or "directly connected to" another element, there are no intervening elements present.

The terms "include" and "comprise" as well as derivatives and variations thereof, in all of their syntactic contexts, are to be construed without limitation in an open, inclusive sense (e.g., "including, but not limited to"). The term "or," is inclusive, meaning and/or. The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the present disclosure, the terms first, second, etc., may be used to describe various elements, however, these elements are not to be limited by these terms unless the context clearly requires such limitation. These terms are only used to distinguish one element from another. For example, a first machine could be termed a second machine, and, similarly, a second machine could be termed a first machine, without departing from the scope of the inventive concept.

The singular forms "a," "an," and "the" in the present disclosure include plural referents unless the content and context clearly dictates otherwise. The conjunctive terms, "and" and "or" are generally employed in the broadest sense to include "and/or" unless the content and context clearly dictates inclusivity or exclusivity as the case may be. The composition of "and" and "or" when recited herein as "and/or" encompasses an embodiment that includes all of the elements associated thereto and at least one more alternative embodiment that includes fewer than all of the elements associated thereto.

In the present disclosure, conjunctive lists make use of a comma, which may be known as an Oxford comma, a Harvard comma, a serial comma, or another like term. Such lists are intended to connect words, clauses or sentences such that the thing following the comma is also included in the list.

Patent Cooperation Treaty (PCT) application PCT/US2020/042653 filed Jul. 17, 2020, is incorporated herein by reference, in its entirety.

U.S. Provisional Patent Application No. 62/966,919, filed Jan. 28, 2020, is incorporated herein by reference, in its entirety.

The various embodiments described above can be combined to provide further embodiments. Aspects of the embodiments can be modified, if necessary to employ concepts of the various patents, application and publications to provide yet further embodiments.

In the description herein, specific details are set forth in order to provide a thorough understanding of the various example embodiments. It should be appreciated that various modifications to the embodiments will be readily apparent to those skilled in the art, and the generic principles defined herein may be applied to other embodiments and applications without departing from the spirit and scope of the disclosure. Moreover, in the following description, numerous details are set forth for the purpose of explanation. However, one of ordinary skill in the art should understand that embodiments may be practiced without the use of these specific details. In other instances, well-known structures and processes are not shown or described in order to avoid obscuring the description with unnecessary detail. Thus, the present disclosure is not intended to be limited to the embodiments shown but is instead to be accorded the widest scope consistent with the principles and features disclosed herein. Hence, these and other changes can be made to the embodiments in light of the above-detailed description. In general, in the following claims, the terms used should not be construed to limit the claims to the specific embodiments disclosed in the specification but should be construed to include all possible embodiments along with the full scope of equivalents to which such claims are entitled. Accordingly, the claims are not limited by the disclosure.

What is claimed is:

1. An apparatus for positioning and retaining a Rogowski coil around a conductor, the apparatus comprising:
    a first member including a first retention structure configured to receive a first section of the Rogowski coil;
    a second member including a second retention structure configured to receive a second section of the Rogowski coil;
    a coupling mechanism configured to movably deploy at least one of the first member and the second member relative to each other and around the conductor; and
    a non-conductive securing structure configured to engage the conductor and retain the first member and the second member in fixed positions relative to the conductor and to each other.

2. The apparatus of claim 1, wherein the coupling mechanism is a hinge, wherein a first part of the hinge is integrated with or attached to the first member, wherein a second part of the hinge is integrated with or attached to the second member, and wherein the second part of the hinge is configured to receive the first part of the hinge.

3. The apparatus of claim 1, wherein each of the first retention structure and the second retention structure is an L-shaped or U-shaped bracket.

4. The apparatus of claim 1, wherein the first retention structure and the second retention structure face each other after the coupling mechanism deploys the first member relative to the second member and around the conductor.

5. The apparatus of claim 1, wherein the first member and the second member are non-conductive.

6. The apparatus of claim 1, wherein the securing structure includes a first arched element and a second arched element, the first arched element engaging the conductor and retaining the first member in a fixed position relative to the conductor, the second arched element engaging the conductor and retaining the second member in a fixed position relative to the conductor.

7. The apparatus of claim 6, wherein the first arched element includes a tab that is insertable into and out of a first pocket defined by the first member and wherein the second arched element includes a tab that is insertable into and out of a second pocket defined by the second member.

8. The apparatus of claim 1, further comprising:
    a binding mechanism configured to bind the first member and the second member together.

9. The apparatus of claim 8, wherein the binding mechanism includes a zip tie.

10. The apparatus of claim 1, wherein the coupling mechanism includes a zip tie.

11. The apparatus of claim 1, wherein:
    the first member is a first fin, the first fin including a first fin body and a first bracket, the first fin body defining a first coil aperture and a first coupling mechanism aperture, the first coil aperture being positioned proximate an end of the first fin body furthest from the first bracket, the first coupling mechanism aperture being positioned proximate an end of the first fin body nearest the first bracket, the first coil aperture being further defined by one or more internal walls of the first fin body;

the second member is a second fin, the second fin including a second fin body and a second bracket, the second fin body defining a second coil aperture and a second coupling mechanism aperture, the second coil aperture being positioned proximate an end of the second fin body furthest from the second bracket, the second coupling mechanism aperture being positioned proximate an end of the second fin body nearest the second bracket, the second coil aperture being further defined by one or more internal walls of the second fin body;

the first retention structure includes the one or more internal walls of the first fin body;

the second retention structure includes the one or more internal walls of the second fin body;

the coupling mechanism includes a zip tie positioned through at least the first coupling mechanism aperture and the second coupling mechanism aperture; and the securing structure includes the first bracket and the second bracket.

12. An apparatus for positioning and retaining a Rogowski coil around a conductor, the apparatus comprising:
a first member defining a first pocket and including a first bracket configured to receive a first section of the Rogowski coil;
a second member defining a second pocket and including a second bracket configured to receive a second section of the Rogowski coil;
a coupling mechanism configured to movably deploy at least one of the first member and the second member relative to each other and around the conductor;
a first non-conductive arched element including a tab that is insertable into and out of the first pocket, the first arched element configured to engage the conductor and retain the first member in a fixed position relative to the conductor when at least one of the first member and the second member is movably deployed around the conductor; and
a second non-conductive arched element including a tab that is insertable into and out of the second pocket, the second arched element configured to engage the conductor opposite the first arched element and retain the second member in a fixed position relative to the conductor and the first member when at least one of the first member and the second member is movably deployed around the conductor.

13. The apparatus of claim 12, wherein each of the first bracket and the second bracket is L-shaped or U-shaped.

14. The apparatus of claim 12, further comprising:
a binding mechanism configured to bind the first member and the second member together.

15. The apparatus of claim 12, wherein the first bracket and the second bracket face each other after the coupling mechanism deploys the first member relative to the second member and around the conductor.

16. An apparatus for positioning and retaining a Rogowski coil around a conductor, the apparatus comprising:
a first non-conductive fin configured to receive a first section of the Rogowski coil, the first fin including a first fin body and a first bracket, the first fin body defining a first coil aperture and a first coupling mechanism aperture, the first coil aperture being positioned proximate an end of the first fin body furthest from the first bracket, the first coupling mechanism aperture being positioned proximate an end of the first fin body nearest the first bracket, the first coil aperture being further defined by one or more internal walls of the first fin body;
a second non-conductive fin configured to receive a second section of the Rogowski coil, the second fin including a second fin body and a second bracket, the second fin body defining a second coil aperture and a second coupling mechanism aperture, the second coil aperture being positioned proximate an end of the second fin body furthest from the second bracket, the second coupling mechanism aperture being positioned proximate an end of the second fin body nearest the second bracket, the second coil aperture being further defined by one or more internal walls of the second fin body; and
a zip tie positioned through at least the first coupling mechanism aperture and the second coupling mechanism aperture;
wherein the first bracket and the second bracket form at least part of a securing structure configured to engage the conductor and retain the first member and the second member in fixed positions relative to the conductor and to each other.

17. The apparatus of claim 16, further comprising:
a third non-conductive fin configured to receive a third section of the Rogowski coil, the third fin including a third fin body and a third bracket, the third fin body defining a third coil aperture and a third coupling mechanism aperture, the third coil aperture being positioned proximate an end of the third fin body furthest from the third bracket, the third coupling mechanism aperture being positioned proximate an end of the third fin body nearest the third bracket, the third coil aperture being further defined by one or more internal walls of the third fin body,
wherein the first bracket, the second bracket, and the third bracket form at least part of the securing structure.

18. The apparatus of claim 17, wherein the one or more internal walls of the first fin body support the first section of the Rogowski coil, the one or more internal walls of the second fin body support the section of the Rogowski coil, and the one or more internal walls of the third fin body support the third section of the Rogowski coil.

* * * * *